United States Patent [19]

Weaver

[11] Patent Number: 5,200,707
[45] Date of Patent: Apr. 6, 1993

[54] AMPLIFIER WITH MULTIPLE SWITCHED STAGES AND NOISE SUPPRESSION

[75] Inventor: Bryan A. Weaver, Dallas, Tex.

[73] Assignee: Continental Electronics Corporation, Dallas, Tex.

[21] Appl. No.: 795,142

[22] Filed: Nov. 20, 1991

Related U.S. Application Data

[63] Continuation-in-part of Ser. No. 533,646, Jun. 5, 1990, Pat. No. 5,099,203.

[51] Int. Cl.$^5$ ............................................. H03F 3/38
[52] U.S. Cl. .................. 330/10; 330/207 A; 330/251; 455/108
[58] Field of Search .................. 330/10, 207 A, 251, 330/149; 332/181; 455/108

[56] References Cited

U.S. PATENT DOCUMENTS

| | | | |
|---|---|---|---|
| 4,164,714 | 8/1979 | Swanson | 330/10 |
| 4,369,409 | 1/1983 | Kyrian et al. | 330/10 |
| 4,403,197 | 9/1983 | Swanson | 330/10 |
| 4,468,626 | 8/1984 | Swanson | 330/10 |
| 4,560,944 | 12/1985 | Furrer | 330/10 |
| 4,724,420 | 2/1988 | Woodard | 340/347 DA |
| 4,730,167 | 3/1988 | Beeken et al. | 330/10 |
| 4,896,372 | 1/1990 | Weaver | 455/108 |

Primary Examiner—James B. Mullins
Attorney, Agent, or Firm—Lowe, Price, LeBlanc & Becker

[57] ABSTRACT

An amplifier has at least several stages activated only to one of two bi-level states controlled in response to the value of an input source exceeding a threshold for each stage. Each stage has a different threshold. The thresholds and source are arranged so that the stages change between the bi-level states as the value of the source changes relative to the thresholds of the different stages. Bi-level outputs of the stages are summed together. The values of the thresholds are continuously varied by a small amount relative to a predetermined maximum value for the source in response to a noise source that is independent of the signal source. A power supply for the stages includes an AC-DC converter having plural primary windings and several secondary windings, one for each of the stages. The windings are coupled together so that at all times loading of the primary windings by the secondary windings as a result of activation of the output stages is approximately equal. The stages are controlled so that the sum of the outputs of the stages remains a predetermined function despite one or a few of the stages failing.

50 Claims, 3 Drawing Sheets

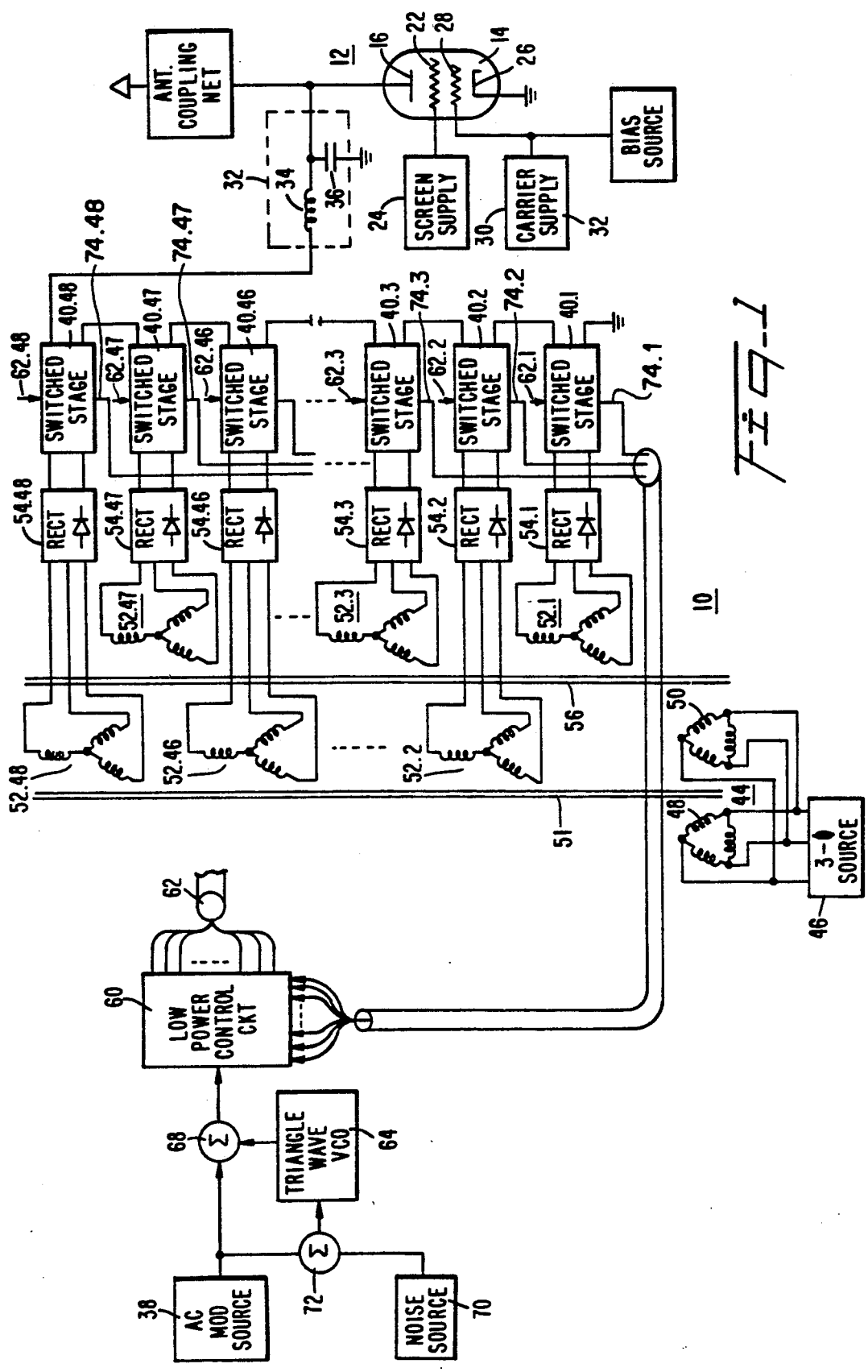
FIG_1

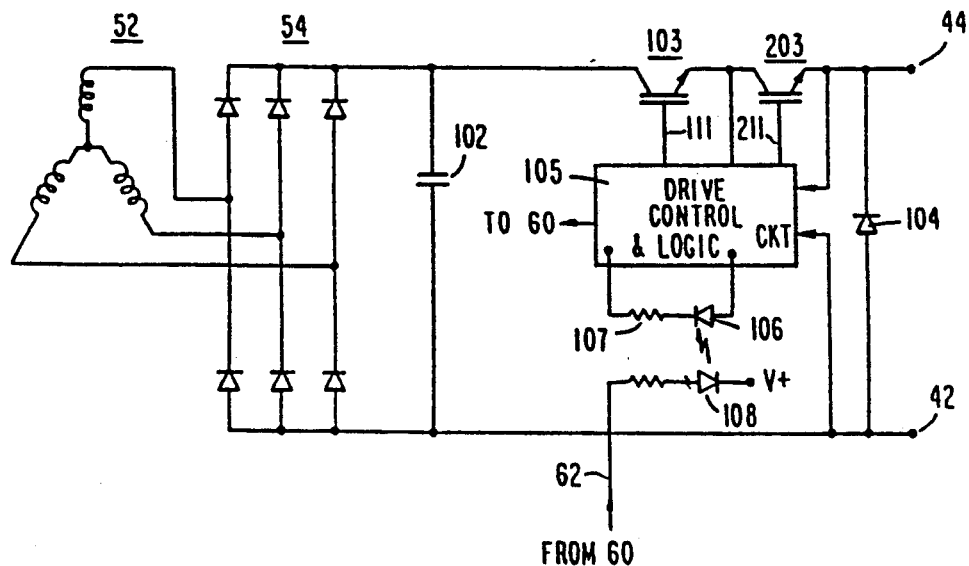
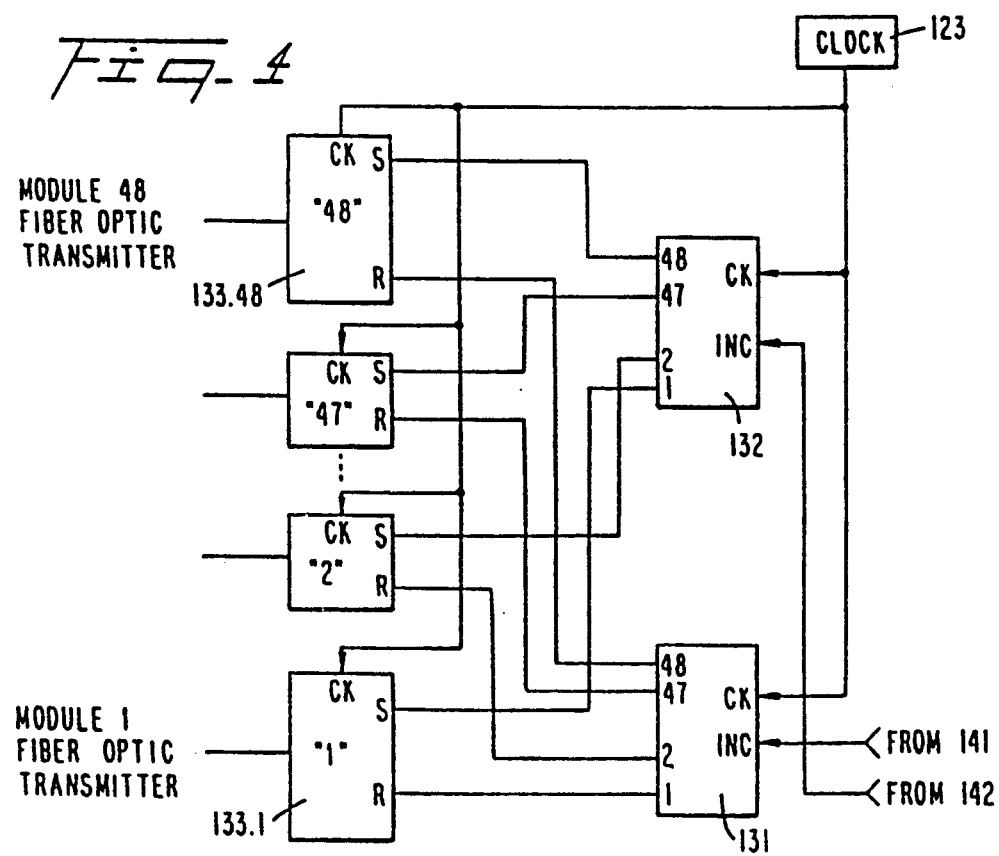

AMPLIFIER WITH MULTIPLE SWITCHED STAGES AND NOISE SUPPRESSION

RELATION TO CO-PENDING APPLICATION

The present application is a continuation-in-part of Ser. No. 07/533,646, filed Jun. 5, 1990, now U.S. Pat. No. 5,099,203, entitled POWER AMPLIFIER HAVING MULTIPLE SWITCHED STAGES AND METHOD OF OPERATING SAME, commonly assigned with the present application.

FIELD OF INVENTION

The present invention relates generally to amplifiers and more particularly to an amplifier having at least several stages activated only to bi-level outputs which are summed together, which amplifier includes provisions for substantial noise reduction.

BACKGROUND ART

In the aforementioned co-pending application there is disclosed an amplifier responsive to a signal source comprising at least several stages activated only to one of two bi-level states (sourced and unsourced) controlled in response to the value of a signal source exceeding a different threshold for each stage. The thresholds and source are arranged so that the stages change between the bi-level states as the value of the source changes relative to the thresholds of the different stages. Bi-level outputs associated with the bi-level states of the plural stages are summed together. The values of the thresholds are continuously varied by a small amount relative to a predetermined maximum value for the source. In the preferred embodiment, the threshold values are varied by applying a wave having a continuously varying amplitude in parallel to the various stages. Preferably, the continuously varying wave is derived from a variable frequency voltage controlled oscillator and is a triangular wave having a frequency determined by the amplitude and frequency of the signal source. As the amplitude and frequency of the signal source increase the triangular wave frequency increases from a nominal value thereof. The amplifier disclosed in the co-pending application is, in a preferred use, responsive to an audio signal source, e.g. speech or music, and is part of an amplifier for controlling plate modulation of a high-power amplitude modulated radio frequency transmitter. The output wave derived from the amplifier is a high-voltage replica of the input signal supplied to the amplifier.

In the preferred embodiment of the prior art amplifier, 48 output stages are employed. The output stages are powered by an AC to DC converter arrangement driven by a three-phase source. The AC to DC converter arrangement includes two primary windings and a secondary winding for each output stage. Each secondary winding is connected to a separate rectifier for supplying DC energizing voltage to the stage associated with it. One primary winding is coupled via a magnetic core to the secondary windings powering output stages 1-24, while the second primary winding is coupled via a second core to the secondary windings which drive output stages 25-48. The output stages are energized by control circuitry for them so that consecutively numbered stages are activated to a first of the bi-level states and the remaining output stages are activated to the other bi-level state. In the preferred embodiment of the prior art, there is a continual change at a predetermined frequency of which output stages are sourced. The change occurs even if there is no change in the amplitude of the input signal over a certain time. Such continuous changing obviates the tendency for certain stages to be virtually continuously dissipating power while other stages virtually never dissipate power.

The amplifier disclosed in the above-mentioned application functions admirably for many situations. For other situations, the amplifier, through actual testing, has been found to produce excessive noise components. I have determined that two sources of the excessive noise components are (1) unequal loading of the two primary windings coupled to the secondary windings which drive the output stages and (2) excessively high amplitude components associated with changing the thresholds in switching the stages between the bi-level states.

The first noise components are at a frequency determined by the number of output stages and the frequency at which the stages are switched. To understand how the first noise components are derived, consider the situation wherein the input signal is constant, at zero AC amplitude, resulting in one-half of the output stages being in the sourced state and the remaining output stages being unsourced. At one instant of time, stages 1-24 are sourced, while stages 25-48 are unsourced. At a second time instant, a few milliseconds after the first time instant, stages 1-12 and 37-48 are unsourced simultaneously with stages 13-36 being sourced. At a third time instant, displaced a few milliseconds from the second time instant, stages 1-24 are unsourced and stages 25-48 are sourced.

During the first mentioned time instant, the first primary winding is fully loaded and the second primary winding is completely unloaded. Thereby, the voltage supplied by the first transformer to stages 1-24 is a relatively low voltage. The sum of the output voltages derived from stages 1-24 is thereby somewhat lower than expected. At the second time instant, the voltages of the two primary windings are approximately halfway between the minimum voltage, as occurs when the primary windings are fully loaded, and the maximum transformer primary windings, which occurs when the primary windings are completely unloaded. Thereby, the voltages supplied to stages 13-36 are greater than during the first time instant and the sum of the output voltages derived from these 24 stages during the second instant is somewhat greater than the sum of the output voltages derived from stages 1-24 during the first-mentioned instant. During the third instant, the second primary winding is fully loaded, causing the sum of the output voltages of stages 25-48 to be virtually the same as during the first mentioned instant. Hence, the resultant sum of the output voltages of all 48 stages varies at a frequency determined by the number of stages and the switching frequency of the stages, even though there is no change in the amplitude of the input signal driving the amplifier.

The second source of the noise components, excessively high amplitude components associated with changing the thresholds of the states in switching the stages between the bi-level states, occurs as a result of the tendency of the variable frequency voltage controlled oscillator to produce sidebands in the frequency band of the input signal being amplified. The voltage controlled oscillator, preferably of the type disclosed in commonly assigned U.S. Pat. No. 4,896,372, has a nominal frequency, such as 70 kHz, considerably above the 5 or 10 kHz bandwidth of the input audio signal source. In response to increases in the amplitude and frequency of the input source, the output frequency of the voltage controlled oscillator increases relative to the nominal 70 kHz value thereof. In addition to the increased frequency of the voltage controlled oscillator output, I have found that the oscillator derives sidebands having frequency components that can overlap into the spectrum of the input signal. Due to the nature in which the sidebands are derived, as governed by Bessel function relationships, the amplitude of the overlapping sidebands can be relatively high. Since the voltage controlled oscillator output determines the threshold level of the output stages, the relatively high amplitude overlapping sidebands derived from the voltage controlled oscillator introduce noise in the output of the amplifier.

It is, accordingly, an object of the present invention to provide a new and improved amplifier having at least several output stages driven only between bi-level outputs which are summed together, wherein the noise content of the signal derived by the amplifier is significantly reduced relative to the prior art.

Another object of the present invention is to provide a new and improved amplifier including at least several output stages having only bi-level outputs tha are summed together, wherein the stages are driven by plural primary windings in such a manner that the primary windings are at all times approximately equally loaded.

A further object of the present invention is to provide a new and improved amplifier including at least several stages having only bi-level outputs that are summed together and wherein variable thresholds of the stages are controlled by an oscillator which derives a variable frequency output as a function of an input signal and tendencies for sidebands of the oscillator to be perceptively coupled to the output of the amplifier are appreciably reduced.

THE INVENTION

In accordance with one aspect of the invention, an amplifier responsive to a source comprises at least several power output stages activated only to one of two bi-level states controlled in response to the value of the source. Bi-level outputs associated with the bi-level states of the several stages are summed together. Power supply means including an AC to DC converter for the stages includes plural primary windings and several secondary windings, one for each of the stages. The windings are coupled together so that at all times loading of the primary windings by the secondary windings as a result of activation of the output stages is approximately equal. Thereby, as the output stages are switched between the sourced and unsourced states, with no changes of input voltage, voltages derived from the primary windings and supplied to the secondary windings are approximately equal so that the sum of the voltages of the output stages is constant. Thereby, the first mentioned noise components of the prior art are substantially reduced to a level that can not be perceived by a listener of a receiver responsive to the transmitter.

In one preferred embodiment, N of the primary windings and M of the secondary windings are provided, where M and N are positive integers greater than 1 and M is substantially greater than N. The stages are activated so that consecutively numbered stages $M_{j-}$, $M_j$, $M_{j+1}$ are susceptible of being activated to the same bi-level state simultaneously. The windings are coupled to each other so that current from different ones of the primary windings is supplied to the secondary windings connected to stages $M_{j-1}$ and $M_j$ when stages $M_{j-1}$ and $M_j$ are in a sourced state and current from different ones of the primary windings is supplied to the secondary windings connected to stages $M_j$ and $M_{j+1}$ when stages $M_j$ and $M_{j+1}$ are in a sourced state.

In the specifically disclosed embodiment, N=2 so that current from a first primary winding is supplied to the secondary windings connected to even-numbered output stages and current from a second primary winding is supplied to the secondary windings connected to odd-numbered output stages. In other words, the first transformer is coupled to secondary windings connected to stages 1, 3, 5 etc., while the second primary winding is coupled to secondary windings connected to supply power to stages 2, 4, 6 etc.

In accordance with another aspect of the invention, the second noise components are reduced to an imperceptible level by spreading the sidebands of the thresholds over a wide frequency range, thereby reducing the amplitude of all of the threshold sideband components. Because no particular sideband component controlling the thresholds is particularly large, the noise level at any particular frequency of the amplifier output is relatively imperceptible.

To these ends, in accordance with the second aspect of the invention, an amplifier responsive to an input source comprises at least several stages activated only to one of two bi-level states controlled in response to the value of the source exceeding a threshold for each stage. Each stage has a different threshold. The thresholds and source are arranged so that the stages change between the bi-level states as the value of the source changes relative to the thresholds of the different stages. Bi-level outputs associated with the bi-level states of the plural stages are summed together. The values of the thresholds are continuously varied by a small amount relative to a predetermined maximum value for the source. The variation is controlled, inter alia, by a noise source which spreads the frequency of the variable threshold into a spectrum such that amplitude variations of the variable threshold are maintained relatively low.

In the preferred embodiment, the variable threshold is controlled by the output of a voltage controlled oscillator having a frequency that is controlled by the amplitude and frequency of a noise source. The frequency of the oscillator is also preferably determined by the input source, particularly the frequency and amplitude of the input source, to maximize fidelity.

In accordance with a further aspect of the invention, an amplifier responsive to an input source comprises at least several stages activated only to one of two bi-level states. The bi-level outputs associated with the bi-level states of the stages are summed together to derive a summed response that is a step-wise function of the input source. A means responsive to the input source activates the stages so that the number of stages in one of the states is commensurate with the combination of the value of the source and a continuously varying signal controlled, inter alia, by a noise source. The continuously varying signal always has a small value relative to a predetermined maximum value of the source.

In accordance with a further aspect of the invention, an amplifier responsive to an input source having a value N+k susceptible of having changing values as a function of time comprises at least several stages activated only to one of two different bi-level states. Bi-level outputs associated with the bi-level states of the stages are summed together to derive a summed response. A means responsive to the input source activates the stages so that the number of stages in one of the states is proportional to N and at least one of the stages is pulsewidth modulated. The duty cycle of the pulsewidth modulation is proportional to k, which includes a noise function. The average value of the summed responses over one cycle of the pulsewidth modulation is proportional to N+k. Any one of the stages is susceptible of pulsewidth modulation proportional to k.

In accordance with a further aspect of the invention, an amplifier responsive to an input source having a changing value as a function of time comprises at least several stages activated only to one of two bi-level states controlled in response to the value of the input source exceeding a threshold for each stage. The thresholds and source are arranged so that the stages change between the bi-level states as the value of the input source changes relative to the thresholds of the different stages. Bi-level outputs associated with the bi-level states of the stages are summed together. The values of the thresholds are continuously varied relative to a median threshold by an amount that is a function of the value of the input source and a noise source.

A feature of the invention is that the amplifier does not produce a distorted output even if one or a few output stages fail while a signal to be amplified is being supplied to the amplifier. While I am aware of a prior art amplifier including (1) at least several stages having bi-level outputs that are summed together and (2) a distortion preventing arrangement in the event of a stage failure, the prior art distortion preventing arrangement is not operational while the signal to be amplified is being supplied to the amplifier. In the prior art arrangement, the presence of a stage failure is detected prior to a signal being derived from a transmitter responsive to the amplifier output. If a stage failure is detected, the failed stage is essentially removed from the amplifier and a spare stage is added prior to the transmission.

Hence, in accordance with a further aspect of the invention, an amplifier responsive to a signal source derives an output wave that is a predetermined stepwise function of the signal of the source and comprises at least several power output stages activated only to one of two bi-level states controlled in response to the value of the source. Bi-level outputs associated with the bi-level states of the plural stages are summed together. A failure of any of the stages is sensed while the amplifier is responsive to the signal of the sources. Means responsive to a failure being sensed controls the power output stages so that the output wave remains the predetermined stepwise function despite the presence of the failure.

In one preferred embodiment, the means for controlling includes a separate control circuit for each stage, and means responsive to a failure being sensed for disabling the control circuit for the stage sensed to have a failure so that the stage sensed to have a failure can not be sourced.

Preferably, the means for controlling includes means for deriving an indication of the number of output stages in one of said states, and means responsive to a failure being sensed for preventing the failed stage from contributing to the indication of the number of output stages being in the one state.

Hence, an additional object of the present invention is to provide a new and improved amplifier including at least several stages having only bi-level outputs that are summed together and wherein a failure of the output stage during operation of the amplifier does not adversely affect distortion of the amplifier output signal.

The above and still further objects, features and advantages of the present invention will become apparent upon consideration of the following detailed description of a specific embodiment thereof, especially when taken in conjunction with the accompanying drawings.

BRIEF DESCRIPTION OF DRAWINGS

FIG. 1 is a partial schematic, partial block diagram of a transmitter including a preferred embodiment of an amplifier in accordance with a preferred embodiment of the invention;

FIG. 2 is a schematic diagram of a stage that can be employed in the amplifier of FIG. 1;

FIG. 4 is a block diagram of digital circuitry employed in the low power amplifier of FIG. 3.

DESCRIPTION OF THE PREFERRED EMBODIMENT

Figure 3:
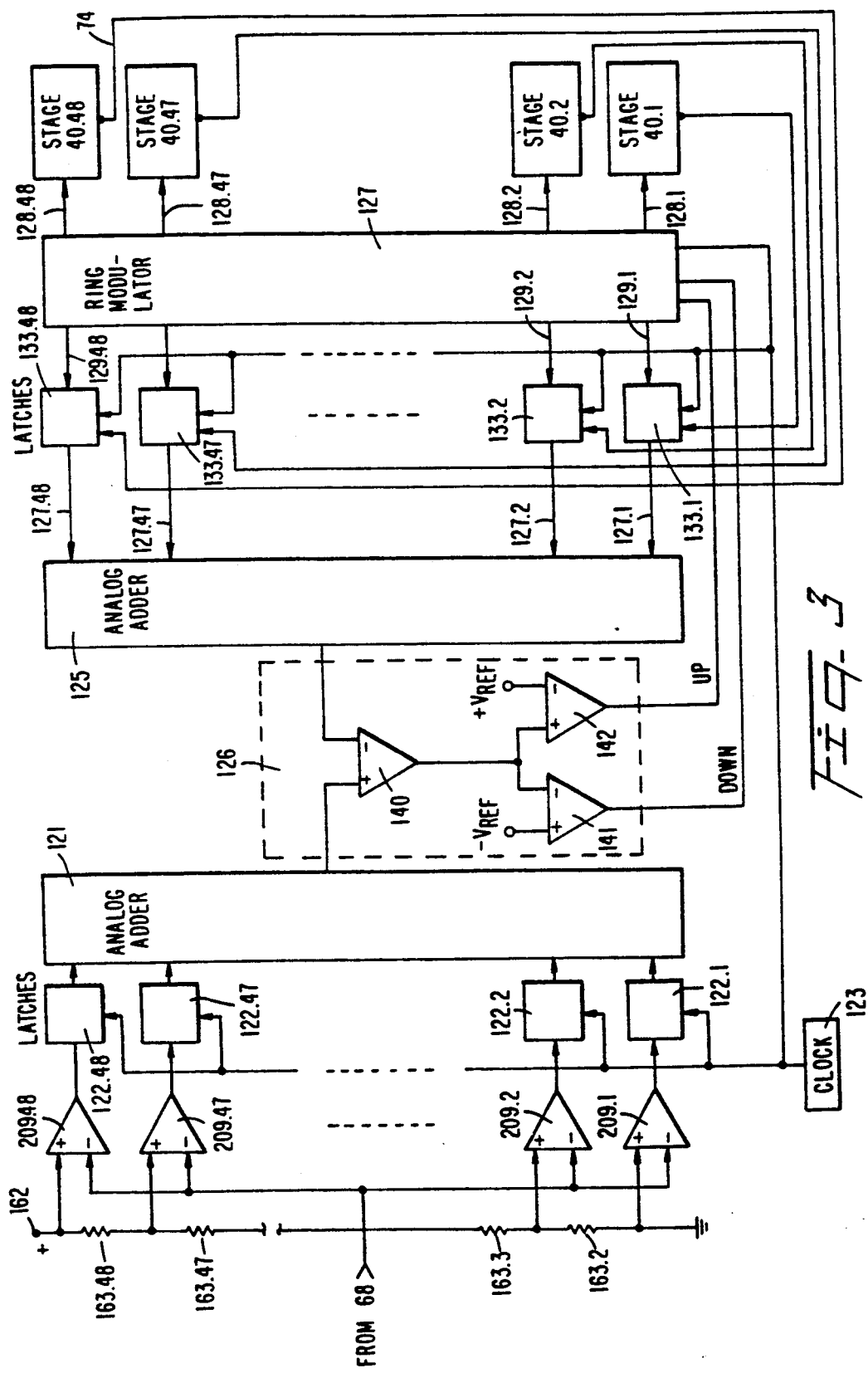
FIG. 3 is a partial block, partial schematic diagram of a low power amplifier employed in FIG. 1.

Reference is now made to FIG. 1 of the drawing wherein amplifier 10 of the present invention is illustrated as a modulator for output stage 12 of a high power amplitude modulated radio frequency transmitter including tetrode 14. Tetrode 14 includes anode 16 to which the output voltage of amplifier 10 is applied. Anode 16 feeds antenna 18 via antenna coupling network 20. Tetrode 12 also includes screen grid 22, supplied with DC bias voltage by screen supply 24. Tetrode 12 also includes grounded cathode 26 and control grid 28, connected to carrier supply 30 and bias source 32 which cause the tetrode to be class C driven.

Variable DC voltage that is a high voltage replica of the input of amplifier 10 (derived from audio AC modulation source 38, typically a music or voice source) is applied to plate 16 by the output of low pass filter 32, including series inductor 34 and shunt capacitor 36. Filter 32 is supplied with a varying high voltage DC step-wise waveform that is an approximate replica of AC source 38.

The varying voltage applied to lowpass filter 32 is derived from M identical series-connected electronic switched stages 40.1, 40.2, 40.3, ... 40.(M-2), 40.(M-1), 40.M, selectively activated to only one of two bi-level states as a function of the amplitude of source 38; M is a relatively large number, e.g. somewhat in excess of 48. Like components associated with the different identical stages bear the same reference numerals to the left of a decimal point, while components of the same stage have the same reference numeral, equal to the stage number, to the right of the decimal point. When the stages and elements associated therewith are discussed in general only the reference numerals to the left of the decimal point are used.

In one state, stages 40 are sourced to a constant DC power supply voltage, while in the second state, the stages are unsourced. Each of stages 40, when sourced, typically supplies a voltage of about 750 volts to output terminals 42 and 44 thereof; in the unsourced state, each of stages 40 supplies virtually zero volts to the output terminals thereof. Thereby, in response to all of stages 40 being sourced, the voltage sum derived from the series-stacked stages is approximately 36 kilovolts and when all of the stages are unsourced, the voltage sum derived from stages 40 is approximately zero volts. In an amplifier including 48 output stages that can be sourced, the voltage supplied to lowpass filter 32 is capable of varying between approximately zero volts and approximately 36 kilovolts. When the voltage of source 38 is zero, the input voltage to filter 32 is 18 kilovolts; the maximum positive and negative voltages of source 38 (typically 2.4 and −2.4 volts respectively) result in voltages of 36 kilovolts and 0 volts being applied to the filter.

Power is supplied to stages 40 by AC to DC converter network 44 responsive to three-phase source 46. Converter 44 includes two delta connected three-phase primary windings 48 and 50 driven in parallel by the output of three-phase source 46. Primary winding 48 is coupled by magnetic core 51 to wye connected secondary windings $52.2 \ldots 52.(M-2), 52.(M)$ which in turn drive three-phase rectifiers $54.2 \ldots 54.(M-2), 54.(M)$ for respectively supplying DC power to stages $40.2 \ldots 40.(M-2)$ and $40.(M)$. Primary winding 50 is coupled by magnetic core 56 to wye connected secondary windings $52.1, 52.3 \ldots 52.(M-1)$, in turn connected to drive three-phase rectifiers $54.1, 54.3 \ldots 54.(M-1)$, for respectively supplying DC power to stages 40.1, 40.3 and 40.(M-1). Thus, primary winding 48 supplies power to even-numbered stages $40.2 \ldots 40.(M-2), 40.(M)$ [where M is an even integer] while primary winding 50 supplies power to odd-numbered stages $40.1, 40.3 \ldots 40.(M-1)$. Because stages 40 are driven to the sourced and unsourced states such that consecutively numbered stages are sourced and unsourced, loading of primary windings 48 and 50 is approximately the same. Thereby, the voltages supplied by primary windings 48 and 50 to the loads driven by them are approximately the same, to substantially reduce noise introduced by differential loading of the primary windings relative to the situation which would exist if stages $$40.1 - 40.\frac{(M)}{2}$$

were driven by primary winding 48 and stages $$40.\frac{(M + 1)}{2} - 40.(M)$$

were driven by primary winding 50.

In the preferred physical arrangement, secondary windings $52.1, 52.3 \ldots 52.(M-1)$, as well as the rectifiers and stages associated therewith, are located in physical proximity with each other and spaced from secondary windings $52.2 \ldots 52.(M-2)$ and $52.(M)$ as well as the stages and rectifiers associated therewith. Controls for the even-numbered stages are provided by coupling appropriate signals to the even and odd-numbered stages by low-level signal couplers. The secondary windings $52.1, 52.2 \ldots 52.(M)$ are as illustrated for convenience in describing and illustrating the parts.

Control of which and how many of stages 40 are in the sourced and unsourced state is provided by low-power control circuit 60, including output leads 62.1, 62.2 ... 62.(M), respectively supplying low-level signals to stages 40.1, 40.2 ... 40.(M). Low-power control circuit 60 supplies bi-level signals to leads 62. The bi-level signals are pulsewidth modulated and have a predetermined frequency, i.e., predetermined period. For a constant, zero amplitude signal derived from AC modulation source 38, as associated with a period of silence, circuit 62 supplies to each of leads 62 a bi-level signal having a duty cycle of 50 percent. The bi-level signals applied to leads 62 are phased displaced from each other so that the signals on adjacent leads are phase displaced by 1/48th of a cycle, i.e., 7.5°. During each cycle of operation of control circuit 60 while such a constant voltage is derived from. source 38, there are constant transitions in the bi-level signals supplied to each of leads 62. Hence, during one instant, binary 1 levels are supplied by circuit 60 to leads $$62.1 - 62.\frac{(M)}{2},$$

while binary 0 levels are supplied to leads $$62.\frac{(M + 1)}{2} - 62.(M).$$

One-half cycle of the operation of control circuit 60 after the previously mentioned instant, the situation is reversed so that 0 binary levels are supplied to leads $$62.1 - 62.\frac{(M)}{2}$$

while binary 1 levels are supplied to leads 62. leads $$62.\frac{(M + 1)}{2} - 62.(M).$$

The binary levels on leads 62 control which of switches or stages 40 are sourced and unsourced. Hence, there are repeated transitions in the stages 40 which are sourced and unsourced, so that the tendency of power to be dissipated in certain of the stages, to the exclusion of the other stages, is obviated.

Control circuit 60 is arranged so that it effectively includes, for each of stages 40, a different variable threshold. The threshold for each stage is varied continuously by the output of triangular wave voltage controlled oscillator (VCO) 64 having a constant peak-to-peak amplitude that is a small percentage of the maximum voltage of AC modulation source 38. In the preferred embodiment wherein the maximum peak to peak voltage of source 38 is 4.8 volts, the maximum peak to peak output voltage of triangular wave voltage controlled oscillator 64 is 0.1 volts. Voltage controlled oscillator 64 is preferably of the type disclosed in commonly-assigned U.S. Pat. No. 4,896,372.

Voltage controlled oscillator 64 derives a variable frequency output having a nominal predetermined value, considerably in excess of the maximum frequency of source 38. In a preferred embodiment, the nominal frequency of oscillator 64 is 70 kHz. As the amplitude and frequency of the control voltage supplied to oscillator 64 at input terminal 66 thereof increase from zero values therefor, the frequency of the oscillator increases relative to the nominal value thereof. Because voltage controlled oscillator 64 is basically a frequency modulator, the oscillator produces sidebands that are positively and negatively displaced relative to the oscillator nominal frequency. Since input terminal 66 of triangular wave voltage controlled oscillator 64 is responsive, inter alia, to the output of AC modulation source 38, the negative sidebands can cause the output of the VCO to extend into the spectrum of source 38.

To control the variable thresholds for switches 40.1–40.48, the variable frequency triangular wave output of voltage controlled oscillator 64 is linearly combined, in summing network 68, with the output of AC modulation source 38. At any instant of time, the output of network 68 is an analog voltage having an amplitude equal to the amplitude of the output of modulation source 38 plus the amplitude of the output of triangular wave voltage controlled oscillator 64. The analog output of network 68 is applied to low-power control circuit 60 to control the bi-level control signals for stages 40.

The frequency of oscillator 64 is controlled by the amplitude and frequency of source 38 because greater fidelity of the replica derived from low-pass filter 32 to the signal of source 38 is obtained by such control. However, controlling the frequency of oscillator 64 in this manner in response to the output of modulator 38 causes the oscillator to produce, in certain instances, components which affect the switching of stages 40. This somewhat spurious switching of stages 40 is noticeable as a noise component in the signal supplied by low-pass filter 32 to plate 16.

In accordance with one aspect of the present invention, the spectrum of the noise is spread so that there is no predominant frequency component introduced as a result of oscillator 64 being responsive to the output of modulation source 38. The spectrum derived from oscillator 64 is spread in this manner by supplying noise source 70 to input terminal 66 of voltage-controlled triangular wave oscillator 64. The output of noise source 70 is linearly combined with the output of modulation source 38 in summing network 72, having an output which is supplied to input terminal 66 of the oscillator. The spectrum of the noise derived from source 70 is limited so that the noise source does not cause excessive modulation of oscillator 64 and possibly introduce additional noise in the output of the amplifier.

In one preferred embodiment, noise source 70 comprises a high gain DC operational amplifier having input terminals connected to a resistor and output terminals connected to a low pass filter having a cutoff frequency of 10 kHz. It is to be understood, however, that other appropriate noise sources can be employed.

To prevent distortion in the event of a failure of one or a few of stages 40, each stage derives on lead 74 a signal having binary one and zero values respectively indicative of the particular stage being in operative and failed states. The signals on leads 74 are coupled to circuit 60 to control the outputs thereof while source 38 is being applied to amplifier 10 so that the sum of the outputs of stages 40 applied to filter 32 is a step wise replica of source 38. Amplifier 10 supplies filter 32 with a voltage having a value that is a predetermined function of the amplitude of source 38 even if there is a failure of one or a few of stages 40 while source 38 is being supplied to the amplifier. Details of the circuitry for providing this result are described infra.

A circuit diagram for one embodiment of each of stages 40 is illustrated in FIG. 2. Each of stages 40 is provided with DC power by three-phase rectifier 54 for converting the three-phase AC voltage at secondary winding 52 into a DC voltage. Rectifier 54 drives shunt capacitor 102 across which is developed a 750 volt DC power supply voltage. The voltage across capacitor 102 is selectively switched to output terminals 42 and 44 through the series connected emitter collector paths of isolated gate bipolar transistors 103 and 203 although other similar devices can be used. Transistors 103 and 203 have bipolar emitter-collector characteristics and high impedance gate, i.e., control electrode, characteristics similar to those of a metal oxide semiconductor field effect transistor. Transistors 103 and 203 include collector and emitter electrodes such that the collector of transistor 103 is connected to one electrode of capacitor 102 and the emitter of transistor 203 is connected to the cathode of diode 104; the emitter of transistor 103 is connected directly to the collector of transistor 203. The anode of diode 104 is connected to the remaining electrode of capacitor 102. Diode 104 is connected across output terminals 42 and 44.

Bias control between the gate and emitter of transistors 103 and 203 is provided by circuit 105 that switches the emitter collector paths of transistors 103 and 203 between a saturated and non-conducting state. In normal operation, transistor 203 is biased to the saturated state and transistor 103 is controlled by the output of circuit 60 on lead 62. (Normal operation is now assumed.) In the saturated state of transistor 103, the DC voltage across capacitor 102 is coupled to terminals 42 and 44, while causing diode 104 to be back biased. When transistor 103 is not conducting, the voltage between terminals 42 and 44 drops quickly to zero by virtue of the relatively low impedance path provided through the anode and cathode of diode 104. Thereby, the impedance between terminals 42 and 44 is maintained at a first predetermined constant value while transistor 103 is in a conducting state, and is maintained at a second, much lower predetermined value while the transistor is not conducting.

Drive control and logic circuit 105 is controlled by an opto-electronic link including photodiode 106, connected to input terminals of circuit 105 via current limiting resistor 107. Diode 106 is optically coupled (e.g. by a fiber optic link) to light emitting diode 108, connected via resistor 111 to be responsive to a signal supplied by low power control circuit 60 to the lead 62 associated with the particular stage including transistor 103. The signal on lead 62 has binary one and zero values to command turn on and turn off of the switch comprising transistor 103.

In response to the signal on lead 62 being a binary one level, diode 108 is activated to illuminate photodiode 106. In contrast, diode 108 derives no optical signal in response to a binary zero level on lead 62. In response to diode 106 being illuminated, circuit 105 supplies a positive forward bias to the gate of transistor 103 via lead 111 to cause transistor 103 to be in the saturated state. When no optical energy is incident on diode 106, circuit 105 back biases the gate of transistor 103 so transistor 103 does not conduct.

The emitter collector path of transistor 203, connected in series with the emitter collector path of transistor 103, is normally forward biased by an output of circuit 105 on lead 211 so that operation of transistor 103 controls the state of the particular stage. However, if the particular output stage 40 is not operating properly the transistor 203 of that stage is biased to cut off. Proper operation of the stage is detected by drive control and logic circuit 105 comparing the bi-level signal derived from photodiode 106 with the output voltage derived from the stage, as developed across diode 104.

If the signal derived from photodiode 106 and the stage output voltage do not correlate, transistor 203 is cut off to cause the particular stage to become inoperative and its operation to be automatically replaced by another output stage 40. The inoperativeness of one or a few output stages does not adversely affect operation of the amplifier. A feedback arrangement (described infra) in control circuit 60 automatically causes the correct number of stages 40 to be sourced and unsourced.

One preferred embodiment of the circuitry included in low-power control circuit 60 is illustrated in FIGS. 3 and 4. The output of summing circuit 68 is applied in parallel to negative input terminals of comparators 209, one of which is provided for each of stages 40 that can be sourced. If, e.g. 48 stages 40 can be sourced, 48 comparators 209 are provided. In the typical situation one or a few spare output stages 40 are included so that if 48 output stages can be sourced for a maximum signal of source 38, 52 output stages are included. Hereafter it is assumed that 48 of comparators 209 are provided to enable 48 of stages 40.1–40.M (where M>48) to be sourced.

Positive input terminals of comparators 209.1–209.48 are responsive to different DC voltages at taps of voltage divider 161, energized by the positive DC voltage at terminal 162. Each of resistors 163.2, 163.3 ... 163.47, 163.48, respectively connected to the positive input terminals of comparators 209.2, 209.3 ... 209.47, 209.48, has an identical value so that in one preferred embodiment wherein the maximum peak to peak voltage of source 38 is 4.8 volts and the maximum peak to peak voltage derived by VCO 64 is 0.1 volts, the voltage between adjacent taps of the voltage divider is 0.1 volts.

The voltages at the taps of voltage divider 161 establish median threshold voltages for the comparators 209 connected to the taps. The threshold is constantly linearly varied about the median value therefor by the triangular wave output of source 68. In response to the amplitude of the voltage at the negative input terminal of a particular comparator 209 exceeding the voltage at the positive input terminal of that comparator, the comparator derives a binary one output. Conversely, in response to the amplitude of the voltage at the positive input terminal of a particular comparator 209 exceeding the voltage at the negative input terminal of that comparator, the comparator derives a binary zero output. Thereby if the signal of source 38 has a value of N+k, comparators 209.1, 209.2 ... 209.(N) derive binary one levels, comparators 209.(N+2), 209.(N+3) ... 209.48 derive binary zero levels and comparator 209.(N+1) derives a bi-level pulse width modulated wave having a duty cycle k, as averaged over one cycle of source 38.

To control which of output stages 40 are in the sourced and non-sourced states, a comparison is made of the number of comparators 209.1–209.48 in the binary one state with the number of output stages 40 in the sourced state. The arrangement is such that if, for example, the amplitude of source 38 remains constant, the number of output stages 40 in the sourced state remains constant; however, which ones of output stages 40 are activated constantly changes, despite the fact that the amplitude of source 38 does not change. For example, if the voltage of source 38 is one-half of the voltage at terminal 162, 24 of the M stages 40 are sourced. During one instant while the voltage of source 38 is one-half of the voltage at terminal 162, stages 40.7–40.30 may be sourced; during a subsequent instant stages 40.8–40.31 may be sourced. During both instants, the sum of the voltages derived by stages 40 is 24×750=18,000 volts.

To these ends, the number of comparators 209.1–209.48 deriving binary one levels is indicated by supplying the binary one output levels of these comparators to analog adding network 121. The output voltage of analog adding network 121 is a DC voltage having, at any one time, one of 48 possible values. Each of the possible output values of analog adder 121 represents the number of comparators 209.1–209.48 which is deriving a binary one level.

The outputs of comparators 209.2–209.48 are sampled many times during each cycle of triangle wave source 68 by respectively supplying the outputs of comparators 209.1–209.48 to sample and hold, i.e., latch networks 122.1–122.48, also responsive to clock source 123, having a frequency of several megaHertz. The latched outputs of latches 122.1–122.48 are applied to analog summing circuit 121. As variations in modulation source 38 and triangular wave source 68 occur, the output level of circuit 121 changes accordingly.

The output signal of adder 121 is compared with a signal indicative of the number of stages 40 in a sourced state, as derived from analog adder 125. Adder 125 is responsive to latch networks 133.1–133.48 respectively responsive to the different binary states of ring modulator 127 and clock 123. Analog adder 125 derives an output having one of 48 different levels, each representing the sourced and non-sourced states of stages 40. The output signals of adders 121 and 125 are supplied to analog comparator 126 which selectively derives one of two positive going, i.e., binary zero to one, transitions as a function of the output signals of adders 121 and 125.

Comparator 126 includes difference amplifier 140 as well as comparators 141 and 142; amplifier 140 has plus and minus inputs respectively responsive to the voltages derived by adders 121 and 125. The output of amplifier 140 is applied in parallel to negative and positive inputs of comparators 141 and 142, having positive and negative inputs respectively responsive to negative and positive DC reference voltages, −Vref and +Vref, where Vref is typically 50 millivolts. In response to the voltage from amplifier 140 applied to the negative input of comparator 141 having a larger negative voltage than −Vref, comparator 141 derives a binary one level; in response to the voltage at the positive input of amplifier 142 exceeding +Vref, comparator 142 derives a binary one output. If the output of difference amplifier 140 is in a dead band from −Vref to +Vref, the output of comparators 141 or 142 are at the binary zero level and no changes occur in ring modulator 127.

The transitions at the outputs of comparator 126 control which of output stages 40 are in the sourced and non-sourced states. To this end, the outputs of comparator 126 are supplied to two separate input terminals of ring modulator 127, also responsive to clock source 123. Ring modulator 127 includes an output lead for each of output stages 40. The number of output stages 40 in a sourced state is generally equal to the number of comparators 209.1–209.48 deriving binary one levels. However, there is no other correlation between which of stages 40 are sourced and which of comparators 109.1–109.48 are deriving binary one levels.

Ring modulator 127 includes two sets of output leads 128 and 129 (one for each of output stages 40) respectively driven in parallel by binary signals representing which of stages 40 are sourced and non-sourced. The signals on output leads 128 are supplied as control inputs to stages 40. These controls include fiber optic links, as described supra. The signals on output leads 128 are supplied as inputs to latches 133 (one for each of output stages 40), thence to analog adder 125.

Details of a preferred embodiment of ring modulator 127 are illustrated in FIG. 4 as including two M stage recirculating shift registers 131 and 132 and M output latches 133, each configured as a J-K flip-flop. Each of shift registers 131 and 132 includes an increment (INC) input terminal responsive to a separate output of comparator network 126 and a clock input terminal responsive to clock source 123. Shift registers 131 and 132 are driven only in a forward direction, so that in response to transitions supplied to the increment inputs thereof, the shift register stage in a binary one state is advanced by a count of one. Only one stage of shift registers 131 and 132 is in a binary one state at a particular time. When a binary one state is in the final stage, i.e., stage M, of each of shift registers 131 and 132 the binary one state of the shift register advances to stage one in response to the next occurrence of a positive going transition at the increment input terminal of the shift register. The state of shift registers 131 and 132 is advanced during the positive going transition of clock 123 immediately following a positive going transition at the increment input of the shift register.

Shift register 131 is incremented in response to binary zero to one transitions in the output of comparator 141, while shift register 132 is incremented in response to binary zero to one transitions in the output of comparator 142. To this end, the outputs of comparators 142 and 141 are respectively connected to the increment inputs of shift registers 132 and 131.

Each of latches 133, one of which is provided for each of stages 40, includes a set (S) and a reset (R) input, as well as a clock input. The clock inputs of latches 133 are driven in parallel by the output of clock source 123. The set inputs of latches 133. 1–133.(M) are respectively connected to output leads of each of stages 1-M of shift register 132. The reset inputs of latches 133.1–133.M are respectively connected to output leads of each of stages 1-M of shift register 131. The output terminals of latches 133.1–133.(M) supply binary one levels to output leads 127.1–127.(M) and 128.1–128 (M) when the latches are set, i.e., in a binary one state.

Each of latches 133 is of a type such that the latches, i.e., flip-flops, are in a binary zero state in response to a binary zero state being supplied to the reset inputs thereof during the previous clock pulse input thereof. Latches 133 are in a binary one state in response to a binary one state being applied to the set inputs thereof during the previous clock pulse input thereof. If a binary one is applied to both the reset and set inputs of a particular latch 133 during a particular clock period, the output state of the particular flip-flop toggles to the opposite binary state, i.e., changes from one to zero or zero to one. Changes in the states of latches 133 occur only during a positive going transition of clock 123 following a binary zero to one transition at the set or reset input of the particular flip-flop.

Conventional reset circuitry, not shown, causes shift registers 131 and 132 to be activated so that stage one thereof is initially set to a binary one state, while each of latches 133 is initially in the reset condition.

In operation, the stages of shift registers 131 and 132 having binary one values therein generally indicate the limits of output stages 40 which are respectively in the reset and set stages; these stages of shift registers 131 and 132 are respectively represented by N(r) and N(s). If N(s) is greater than N(r), output stages 40.N(r+1) through 40.N(s) are sourced while output stages 40.1 through 40.N(r) and 40.N(s+1) through 40.M are non-sourced. If N(r) is greater than N(s), output stages 40.N(r) through 40.N(s−1) are non-sourced while output stages 40.1 through 40.N(r−1) and 40.N(s) through 40.48 are sourced. If N(r) equals N(s), either all or none of output stages 40.1 through 40.(M) are sourced.

The number of output stages 40 which should be in a sourced state, indicated by the output of adder 121, is compared in comparator 126 with the number of output stages 40 in a sourced state, as indicated by the output of adder 125. In response to the output of adder 121 exceeding the output of adder 125 by an amount greater than the deadband between −Vref and +Vref during a cycle time of clock 123, the count in shift register 132 is incremented by a count of one during that cycle time; conversely shift register 131 is incremented by a count of one in response to the output of adder 125 exceeding that of adder 121 during a cycle time of clock 123. Because the states of shift registers 131 and 132 are only incremented in response to the transitions in the outputs of comparator 126, which in turn are responsive to variations of analog source 38 relative to the thresholds established by voltage divider 161 and triangular wave source 64, the relative values of N(s) and N(r) change in response to the amplitude of the output of adder 68, relative to the thresholds established by voltage divider 161. Thereby which of stages 40 are conducting changes on a consistent basis, to prevent constant dissipation in only some of the output stages Each of stages 40 has, in effect, a different threshold that is subject to change depending on the values of N(r) and N(s).

The output voltages of stages 40 have transitions between zero and 750 volts in response to transitions of triangular wave source 64 relative to the amplitude of source 38. The time between these transitions is controlled by the amplitude of source 38. However, different stages 40 are activated into the sourced state at different times in response to the variations of triangular wave source 64. Thereby, the substantial power which is dissipated in the different output stages 40 is shared by these stages.

As long as the voltage of AC modulation source 38 remains constant at a voltage less than the voltage associated with the threshold of one stage, only one of output stages 40 is activated into the sourced state at a time. The sourced duration of a particular stage is determined by the amplitude of source 38. All of stages 40 are sequentially activated to the sourced state, at a frequency determined by the frequency of source 71. The switching frequency of a particular output stage 34 is basically equal to the frequency of source 64 divided by the number of output stages; typically the switching frequency is about 2 kHz, so that switching losses in each output stage are relatively low. As the voltage of source 38 varies, the number of output stages 40 in a sourced state varies accordingly, as is the conducting interval of one of the stages.

In virtually all instances, except for the very low voltage situation of source 38 wherein the source voltage is less than the threshold voltage of one of stages 40, the difference in the number of stages of shift registers 131 and 132 which are loaded with binary one levels is in excess of one. This causes more than one of latches 133 to be activated into the binary one state at a time. Consequently, more than one of output stages 40 is usually activated simultaneously into a sourced state. The duty cycle of each sourced output stage 40 is determined by the amplitude of the voltage of source 38.

Because control of output stages 40 is determined by an indication of the number of output stages to be sourced, instead of which specific stages are to be sourced, the number of series connected output stages 40 can be, and preferably is, greater than the number of stages required to derive the amplifier maximum output voltage. Thereby, if an output stage 40 fails, there is no disruption in proper operation of the amplifier and the sum of the voltages supplied by the output stages to filter 32 remains a step wise replica of the amplitude of analog source 38.

To enable adder 125 to derive an accurate indication of the number of sourced output stages, the same signal which controls switching transistor 203 of each output stage selectively enables the particular latch 133 which corresponds with the particular output stage 40. To this end, each of drive control and logic circuits 105 includes an opto-electronic link, similar to the link including diodes 106 and 108. In response to a back bias signal being applied to lead 211, to disable the output stage 40, a signal is derived on lead 74 by circuit 105 (FIG. 2) of the output stage. The signal on lead 74 is supplied to the latch 129 corresponding with the failed output stage to prevent derivation of a positive, binary one output of that latch.

For example, if a malfunction of output stage 40.2 occurs, as detected by logic circuit 105.2 detecting that a binary value associated with the voltage across output terminals 42.2 and 44.2 differs from the binary value of the signal on lead 62.2 for in excess of a predetermined time interval, switching transistor 203.2 of stage 40.2 is cut-off and latch 133.2 is disabled so a binary one output cannot be derived from the latch. Stage 40.2 is thereafter unsourced and latch 133.2 is unable to contribute to the input of comparator 126. Since comparator 126 compares the number of output stages that should be sourced with the number of stages actually sourced, the comparator, ring modulator 127 and output stages 40 function as if output stage 40.2 had not been provided. The spare output stages (i.e. stages 40 in excess of the number of comparators 209) enable a maximum output voltage to be obtained in the event of a failure of one or a few output stages. Hence, in the event of a failure of one or a few output stages, correct operation continues because comparator 126 derives a signal indicating that a further output stage is to be sourced.

While there has been described and illustrated one specific embodiment of the invention, it will be clear that variations in the details of the embodiment specifically illustrated and described may be made without departing from the true spirit and scope of the invention as defined in the appended claims.

I claim:

1. An amplifier responsive to a signal source comprising at least several power output stages activated only to one of two bi-level states controlled in response to the value of the source, bi-level outputs associated with the bi-level states of the plural stages being summed together, power supply means including an AC to DC converter for said stages, said converter including plural primary windings and several secondary windings, one for each of the stages, each of said secondary windings being coupled to only one of the primary windings, said windings being coupled together so that at all times loading of the primary windings by the secondary windings as a result of activation of the output stages is approximately equal.

2. An amplifier responsive to a signal source comprising at least several power output stages activated only to one of two bi-level states controlled in response to the value of the source, bi-level outputs associated with the bi-level states of the plural stages being summed together, power supply means including an AC to DC converter for said stages, said converter including plural primary windings and several secondary windings, one for each of the stages, said windings being coupled together so that at all times loading of the primary windings by the secondary windings as a result of activation of the output stages is approximatley equal, N of said primary windings and M of said secondary windings being provided, where M and N are positive integers greater than one and M is substantially greater than N, said stages being activated so that consecutively numbered stages $M_{j-1}$, $M_j$, $M_{j+1}$ are susceptible of being activated to the same bi-level state, the windings being coupled to each other so that the secondary windings are connected to stages $M_{j-1}$, $M_j$, $M_{j+1}$ to cause (a) current from different ones of the primary windings to be supplied to the secondary windings connected to stages $M_{j-1}$ and $M_j$ when stages $M_{j-1}$ and $M_j$ are in a sourced state and (b) current from different ones of the primary windings to be supplied to the secondary windings connected to stages $M_j$ and $M_{j+1}$ when stages $M_j$ and $M_{j+1}$ are in a sourced state, where j is selectively every one of 1,2 ... M.

3. The amplifier of claim 2 wherein N=2 so that current from a first primary winding is supplied to the secondary windings connected to even-numbered output stages and current from a second primary winding is supplied to the secondary windings connected to odd-numbered output stages.

4. An amplifier responsive to a signal source comprising at least several power output stages activated only to one of two bi-level states controlled in response to the value of the source, bi-level outputs associated with the bi-level states of the plural stages being summed together, power supply means including an AC to DC converter for said stages, said converter including plural primary windings and several secondary windings, one for each of the stages, said windings being coupled together so that at all times loading of the primary windings by the secondary windings as a result of activation of the output stages is approximately equal, the summed outputs of the plural stages being an output wave that is a predetermined step wise function of the signal of the signal source, means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

5. An amplifier responsive to a signal source comprising at least several stages activated only to one of two bi-level states controlled in response to the value of the source exceeding a threshold for each stage, each stage having a different threshold, said thresholds and source being arranged so that the stages change between said bi-level states as the value of the source change relative to the thresholds of the different stages, bi-level outputs associated with the bi-level states of the plural stages being summed together, and means, including a noise source separate from the signal source, for continuously varying the values of the thresholds by a small amount relative to a predetermined maximum value for the signal source.

6. The amplifier of claim 5 further including power supply means including an AC to DC converter for said stages, said converter including plural primary windings and several secondary windings, one for each of the stages, said windings being coupled together so that at all times loading of the primary windings by the secondary windings as a result of activation of the output stages is approximately equal.

7. The amplifier of claim 6 wherein the summed outputs of the plural stages is an output wave that is a predetermined step wise function of the signal of the signal source, and further including means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

8. The amplifier of claim 5 wherein the means for varying the threshold values includes a variable frequency oscillator for deriving a wave for controlling the thresholds, the wave having a frequency controlled by the sources.

9. The amplifier of claim 5 wherein the means for varying the threshold values includes a variable frequency oscillator for deriving a wave for controlling the thresholds, the wave having a frequency controlled by the amplitude and frequency of the sources.

10. The amplifier of claim 5 wherein the means for varying the threshold values includes a variable frequency oscillator for deriving a wave for controlling the thresholds, the wave having a frequency controlled by the amplitude of the sources.

11. The amplifier of claim 5 wherein the means for varying the threshold values includes a variable frequency oscillator for deriving a wave for controlling the thresholds, the wave having a frequency controlled by the frequency of the sources.

12. The amplifier of claim 5 wherein the summed outputs of the plural stages is an output wave that is a predetermined step wise function of the signal of the signal source, and further including means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

13. An amplifier responsive to a signal source having changing values as a function of time comprising at least several stages activated only to one of two bi-level states controlled in response to the value of the source exceeding a threshold for each stage, said thresholds and source being arranged so that the stages change between said bi-level states as the value of the source changes relative to the thresholds of the different stages, bi-level outputs associates with the bi-level states of the stages being summed together, and means for continuously varying the value of the thresholds relative to a median threshold by an amount that is a function of the value of the signal source and a noise source.

14. The amplifier of claim 13 wherein each of said stages has a different median threshold and the state of each stage changes as the values of the signal and noise sources change relative to the threshold for the stage.

15. The amplifier of claim 14 wherein the means for varying the threshold values includes a variable frequency oscillator for deriving a wave for controlling the thresholds, the wave having a frequency controlled by the sources.

16. The amplifier of claim 14 wherein the means for varying the threshold values includes a variable frequency oscillator for deriving a wave for controlling the thresholds, the wave having a frequency controlled by the amplitude and frequency of the sources.

17. The amplifier of claim 14 wherein the means for varying the threshold values includes a variable frequency oscillator for deriving a wave for controlling the thresholds, the wave having a frequency controlled by the amplitude of the sources.

18. The amplifier of claim 14 wherein the means for varying the threshold values includes a variable frequency oscillator for deriving a wave for controlling the thresholds, the wave having a frequency controlled by the frequency of the sources.

19. The amplifier of claim 13 further including power supply means including an AC to DC converter for said stages, said converter including plural primary windings and several secondary windings, one for each of the stages, said windings being coupled together so that at all times loading of the primary windings by the secondary windings as a result of activation of the output stages is approximately equal.

20. The amplifier of claim 19 wherein the summed outputs of the plural stages is an output wave that is a predetermined step wise function of the signal of the signal source, and further including means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

21. The amplifier of claim 13 wherein the summed outputs of the plural stages is an output wave that is a predetermined step wise function of the signal of the signal source, and further including means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

22. An amplifier responsive to a signal source having a value $N+k$ susceptible of having changing values as a function of time comprising at least several stages activated only to one of two different bi-level states, bi-level outputs associated with the bi-level states of the stages being summed together to derive a summed response, a noise source, where N is an integral value defined by a maximum value for the signal source divided by the number of said at least several stages and k is a fraction of N, and means responsive to the sources for activating the stages so that the number of stages in one of said states is proportional to N and at least one of the stages is pulse width modulated, the duty cycle of the pulse width modulation being proportional to k and a function of the noise source so that the average value of the summed responses over one cycle of the pulse width modulation is proportional to $N+k$, any one of said stages being susceptible of pulse width modulation proportional to k.

23. The amplifier of claim 22 further including power supply means including an AC to DC converter for said stages, said converter including plural primary windings and several secondary windings, one for each of the stages, said windings being coupled together so that at all times loading of the primary windings by the secondary windings as a result of activation of the output stages is approximately equal.

24. The amplifier of claim 23 wherein the summed outputs of the plural stages is an output wave that is a predetermined step wise function of the signal of the signal source, and further including means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

25. The amplifier of claim 22 wherein the means for controlling the duty cycle includes a variable frequency oscillator for deriving a wave having a frequency controlled by the sources.

26. The amplifier of claim 22 wherein the means for controlling the duty cycle includes a variable frequency oscillator for deriving a wave having a frequency controlled by the amplitude and frequency of the sources.

27. The amplifier of claim 22 wherein the means for controlling the duty cycle includes a variable frequency oscillator for deriving a wave having a frequency controlled by the amplitude of the sources.

28. The amplifier of claim 22 wherein the means for controlling the duty cycle includes a variable frequency oscillator for deriving a wave having a frequency controlled by the frequency of the sources.

29. The amplifier of claim 22 wherein the summed outputs of the plural stages is an output wave that is a predetermined step wise function of the signal of the signal source, and further including means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

30. An amplifier responsive to a signal source susceptible of having changing values as a function of time comprising at least several stages activated only to one of two different bi-level states, bi-level outputs associated with the bi-level states of the stages being summed together to derive a summed response that is a stepwise function of the source, a noise source, and means responsive to the sources for activating the stages so that the number of stages in one of said states is commensurate with the combination of the value of the signal source and a continuously varying signal that is a function of the noise source and which always has a small value relative to a predetermined maximum value of the signal source.

31. The amplifier of claim 30 further including power supply means including an AC to DC converter for said stages, said converter including plural primary windings and several secondary windings, one for each of the stages, said windings being coupled together so that at all times loading of the primary windings by the secondary windings as a result of activation of the output stages is approximately equal.

32. The amplifier of claim 31 wherein the summed outputs of the plural stages is an output wave that is a predetermined step wise function of the signal of the signal source, and further including means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

33. The amplifier of claim 30 wherein a source of the continuous varying signal includes means for deriving a wave having a variable frequency controlled by the sources.

34. The amplifier of claim 30 wherein a source of the continuous varying signal includes means for deriving a wave having a variable frequency controlled by the amplitude and frequency of the sources.

35. The amplifier of claim 30 wherein a source of the continuous varying signal includes means for deriving a wave having a variable frequency controlled by the amplitude of the sources.

36. The amplifier of claim 30 wherein a source of the continuous varying signal includes means for deriving a wave having a variable frequency controlled by the frequency of the sources.

37. The amplifier of claim 30 wherein the summed outputs of the plural stages is an output wave that is a predetermined step wise function of the signal of the signal source, and further including means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

38. An amplifier responsive to a signal source having a predetermined spectrum, and predetermined maximum amplitude, the amplifier comprising at least several stages activated only to one of two bi-level states controlled in response to the value of the source exceeding a threshold for each stage, each stage having a different threshold, said thresholds and source being arranged so that the stages change between said bi-level states as the value of the source changes relative to the thresholds of the different stages, bi-level outputs associated with the bi-level states of the plural stages being summed together, and an oscillator for deriving a continuously varying output for varying the values of the thresholds, the output having a small peak-to-peak value relative to the predetermined maximum amplitude, the oscillator output including variable frequencies, some of the variable frequencies having a tendency to introduce a perceptible noise level in the outputs of the stages over the predetermined spectrum, and means for spreading the noise level into a wider spectrum and reducing said noise level at all frequencies in the predetermined spectrum.

39. The amplifier of claim 38 wherein the means for spreading the noise level includes a noise source for controlling the frequency of the oscillator output.

40. The amplifier of claim 39 wherein the oscillator is responsive to the signal source so that the variable frequencies at the oscillator output are controlled by the signal source.

41. The amplifier of claim 39 wherein the oscillator is responsive to the signal source so that the variable frequencies at the oscillator output are controlled by the signal source amplitude and frequency.

42. The amplifier of claim 39 wherein the oscillator is responsive to the signal source so that the variable frequencies at the oscillator output are controlled by the signal source amplitude.

43. The amplifier of claim 39 wherein the oscillator is responsive to the signal source so that the variable frequencies at the oscillator output are controlled by the signal source frequency.

44. The amplifier of claim 38 further including power supply means including an AC to DC converter for said stages, said converter including plural primary windings and several secondary windings, one for each of the stages, said windings being coupled together so that at all times loading of the primary windings by the secondary windings as a result of activation of the output stages is approximately equal.

45. The amplifier of claim 44 wherein the summed outputs of the plural stages is an output wave that is a predetermined step wise function of the signal of the signal source, and further including means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

46. The amplifier of claim 38 wherein the summed outputs of the plural stages is an output wave that is a predetermined step wise function of the signal of the signal source, and further including means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

47. An amplifier responsive to a signal source comprising at least several power output stages activated only to one of two bi-level states controlled in response to the value of the source, bi-level outputs associated with the bi-level states of the plural stages being summed together to be an output wave that is a predetermined stepwise function of the signal of the source, means for sensing a failure of any of said stages while the amplifier is responsive to the signal of the source, and means responsive to a failure being sensed by the means for sensing for controlling the power output stages so that the output wave remains the predetermined stepwise function despite the presence of the failure.

48. The amplifier of claim 47 wherein the means for controlling includes a separate control circuit for each stage, and means responsive to a failure being sensed for disabling the control circuit for the stage sensed to have a failure so that the stage sensed to have a failure can not be sourced.

49. The amplifier of claim 47 wherein the means for controlling includes means for deriving an indication of the number of output stages in one of said states, and means responsive to a failure being sensed for preventing the failed stage from contributing to the indication of the number of output stages being in said one state.

50. The amplifier of claim 49 wherein the means for controlling includes a separate control circuit for each stage, and means responsive to a failure being sensed for disabling the control circuit for the stage sensed to have a failure so that the stage sensed to have a failure can not be sourced.

* * * * *